United States Patent

Harmand et al.

[11] Patent Number: 6,107,113
[45] Date of Patent: Aug. 22, 2000

[54] METHOD OF RELAXING A STRESSED FILM BY MELTING AN INTERFACE LAYER

[75] Inventors: Jean-Christophe Harmand, Villejuif; Andreas Kohl, Paris, both of France

[73] Assignee: France Telecom, France

[21] Appl. No.: 08/987,529

[22] Filed: Dec. 9, 1997

[30] Foreign Application Priority Data

Dec. 10, 1996 [FR] France .................................. 96 15141

[51] Int. Cl.⁷ ........................... H01L 21/00; H01L 21/20; H01L 21/36
[52] U.S. Cl. .............................. 438/46; 438/47; 438/938; 438/483; 438/486
[58] Field of Search ............................. 438/46, 47, 938; 438/483, 486; 117/9

[56] References Cited

U.S. PATENT DOCUMENTS

| | | |
|---|---|---|
| 4,529,455 | 7/1985 | Bean et al. . |
| 4,963,949 | 10/1990 | Wanlass et al. .......................... 357/16 |
| 5,063,166 | 11/1991 | Mooney et al. . |
| 5,225,368 | 7/1993 | Dodson .................................... 437/126 |
| 5,451,552 | 9/1995 | Miles et al. . |

FOREIGN PATENT DOCUMENTS 0 450 228  10/1990  European Pat. Off. ...... H01L 29/267

OTHER PUBLICATIONS

Kadoiwa K et al., Study of Initial Buffer Layer in GaAs–on–Si Growth, Journal of Crystal Growth, vol. 115, No. 1/04, Dec. 2, 1991, pp. 128–132.

*Primary Examiner*—John F. Niebling
*Assistant Examiner*—Josetta Jones
*Attorney, Agent, or Firm*—Blakey Sokoloff Taylor & Zafman

[57] ABSTRACT

The present invention relates to the technological field of manufacturing semiconductor materials for optoelectronic and microelectronic components, and it relates specifically to the method of making stacks of metamorphic layers of materials having lattice mismatches of several percent between one another or relative to the substrate.

15 Claims, No Drawings

METHOD OF RELAXING A STRESSED FILM BY MELTING AN INTERFACE LAYER

FIELD OF THE INVENTION

The present invention relates to the field of technologies for manufacturing semiconductor materials in thin layers for optoelectronic and microelectronic components, and it relates specifically to a method of making stacks of metamorphic layers of material having lattice mismatches of several percent between one another or relative to the substrate.

BACKGROUND OF THE INVENTION

The possibility of making stacks of thin layers of semiconductor materials that are of different natures and thus of different properties, lies behind numerous optoelectronic and microelectronic components, some of which are already being produced on an industrial scale. In most cases, such structures are built up from materials possessing lattice parameters that are equal or very similar (relative difference a few parts per thousand). This restriction is associated with a physical limitation that is often described as being the critical thickness for a material E of parameter $a_e$ grown epitaxially on a substrate material S of parameter $a_s$, and which depends on the relative lattice mismatch $(a_e-a_s)/a_s$ between the two materials, and on implementation conditions.

At less than the critical thickness, the material E grows in two dimensional and stressed manner: its lattice parameter is subjected elastically to tetragonal deformation so as to be equal to that of the substrate in the plane of the layers. The layer of material E is said to be pseudomorphic. Pseudomorphic materials are in widespread use at present.

Above the critical thickness, either dislocation generation is observed in the interface plane, or the two-dimensional layer is observed to transform into islands of material. Both phenomena enable material E to relax.

In both cases, continued growth of material E will give rise to dislocations. These dislocations will pass through the thickness of the material E to find a free surface at which to terminate. The material E is thus degraded. When the material E has returned to its natural lattice parameter, the layer is said to be metamorphic. In order to obtain metamorphic layers of good quality, two kinds of approach can be found in the prior art.

A first approach consists in using intermediate buffer layers which serve to accumulate defects and to preserve the upper layers.

Such buffers may, for example, be stressed super-lattices (T. Won, S. Agarwala and H. Morkoc, Appl. Phys. Lett. 53 (1988), 2311) or graded composition layers (G. H. Olsen, M. S. Abrahams, C. J. Buiocchi and T. J. Zamerowski, J. Appl. Phys. 46 (1975), 1643, and J. C. Harmand, T. Matsuno and K. Inoue, Jap. J. Appl. Phys. 28 (1989), L1101), or indeed layers grown epitaxially at very low temperature (T. Ueda, S. Onozawa, M. Akiyama and M. Sakuta, J. Cryst. Growth 93 (1988), 517). They are generally more than one micron thick.

One case that has been studied extensively in the prior art is that of growing GaAs epitaxially on Si.

The use of thick buffers presents the drawback of buffer volume, given that the purpose of the buffer is to collect structural defects and not to have an active role in the operation of the component that is to be made subsequently. This "dead" volume greatly limits the possibilities offered by associating materials having lattice parameters that are very different since it does not enable two materials to be close enough together on either side of the buffer.

A more recent approach consists in using epitaxial adhesive between the two materials.

Each of the layers to be juxtaposed is then grown epitaxially on a substrate with a matching lattice. Their surfaces are put into contact with pressure being applied, and it is ensured that atomic bonds are formed by heating under a controlled atmosphere of hydrogen or nitrogen. Advantageous results have been obtained with this technique, with mismatch defects remaining confined close to the adhesive interface without spreading through the volume of the materials (G. Patriarche, F. Jeannes, F. Glas and J. L. Oudar, Proceedings of the 9th Int. Conf. on Microscopy of Semiconducting Materials, Oxford, 1995). This technique is presently being developed for making vertical cavity semiconductor lasers. Active layers that match InP are applied, for example, on mirrors that have been grown epitaxially on GaAs (D. I. Babic, K. Streubel, R. P. Mirin, N. M. Margalit, J. E. Bowers, E. L. Hu, D. E. Mars, L. Yang, K. Carey, Phys. Tech. Lett. (1995)). GaAs has been applied to Si (Y. H Yo, R. Bhat, D. M. Hwang, C. Chua and C. H. Lin, Appl. Phys. Lett. 62 (1993), 1038) or indeed InP has been applied to Si (K. Mori, K. Tobutome, K. Nishi and S. Sugou, Electron. Lett. 56 (1990), 737) using this technique.

In the context of epitaxial adhesion, work has so far been done on samples of very small surface area, of the order of 1 cm$^2$. There is no guarantee that such a method will continue to be effective for larger areas. Also, that technique requires two separate epitaxial procedures on respective substrates, followed by said adhesion, and selective removal of one of the substrates. If it is desired to use such adhesion on a plurality of layers, the method becomes cumbersome. Finally, the presence of impurities such as O, C, and Si, at high concentration is probable at the adhesion interface, since, prior to adhesion, both surfaces are covered in a native oxide.

OBJECTS AND SUMMARY OF THE INVENTION

The present invention seeks to provide a method of making stacks of metamorphic layers of semiconductor materials of III-V, II-VI, or IV type, having lattice mismatches of several percent between one another or relative to the substrate. The method of the invention makes it possible, advantageously, to mitigate the limitations of the techniques known in the prior art, such as the use of thick buffers or of epitaxial adhesion, by implementing metamorphic stacks made in a single operation, independently of the size of the sample, and without degrading the state of the material, and in particular without having dislocations passing through its volume. The method of the invention enables structural defects to be confined in an interface zone that is extremely thin, thus enabling said materials to be close to one another.

The method of the invention implements a material E having a melting point $T_F^e$ to be grown epitaxially on a substrate material S having a melting point $T_F^s$ via an interface layer, itself constituted by a material I. The melting point $T_F$ of the material I is low enough to be compatible with avoiding destruction of the materials E and S. In particular, the substances InSb, GaSb, CdTe, and Ge having respective melting temperatures of 530° C., 712° C., 800° C., and 937° C. can be used as interface layer materials.

The sequence of growth steps in the method of the invention is as follows:

a) pseudomorphic deposition of material I of lattice parameter $a_i$ on the substrate material S of lattice parameter $a_s$, at a temperature T lower than $T_F$.

To obtain a pseudomorphic deposit, the thickness of the material I must be less than the critical thickness which is a function of the mismatch $(a_i-a_s)/a_s$ and of the temperature T at which the deposit is made.

The interface zone constituted by material I is made using epitaxy equipment, e.g. equipment making use of molecular beam epitaxy (MBE), and it contains a very low concentration of impurities. It is also as thin as possible, but it must provide at least one plane essentially constituted by atomic bonds specific to the material I constituting it. It comprises less than ten monoatomic layers, typically two or three such layers.

T can be lower than the usual growth temperature in order to enable the critical thickness to be greater, should that be necessary.

b) Pseudomorphic deposition of material E of lattice parameter $a_e$ on the material I constituting the interface layer, at a temperature T less than $T_F$.

The condition for obtaining a pseudomorphic layer is that the thickness of E must be less than the critical thickness which is a function of $(a_e-a_s)/a_s$ and that the total thickness of both deposits is less than the critical thickness which is a function of the mismatches $(a^i-a_s)/a_s$ and $(a_e-a_s)/a_s$ that may be cumulative or compensate, depending on their signs.

As during the first deposition, T may be lower than the usual growth temperature so that the critical thickness can be greater, should that be necessary.

The thickness of the second layer is of the order of a few monoatomic layers, typically fewer than ten.

The sequence of steps a) and b) may advantageously be repeated, typically one to ten times, so as to obtain a periodic stack of layers I and E enabling the material S to be encapsulated better thus preventing it from being degraded during annealing.

c) The interface layer is annealed at a temperature which is high enough to force relaxation of the layer of material E by generating dislocations that are located in I.

The bonds within the interface layer become weaker.

The materials E and S are thus decoupled, and the stress applied to the film E by the substrate S disappears. The film E relaxes. The lattice mismatch is accommodated by atoms being displaced in the interface layer. The temperature at which this step is performed can be equal to $T_F$, in which case the interface layer melts.

Rapid annealing is preferred (less than 1 minute) in order to avoid the stack being brought into equilibrium which would run the risk of causing atoms to be inter-changed between the various layers, and thus giving rise to morphological changes.

d) The interface layer is cooled.

While it is resolidifying, the material I of the interface layer conserves all of the structural defects that enables it to accommodate the lattice parameter difference between the materials E and S.

e) The material E is grown epitaxially.

The material E or any other material having the same lattice parameter $a_e$ can then be grown epitaxially to arbitrary thickness, greater than the critical thickness, without creating new defects.

This sequence of steps can be repeated an indefinite number of times in order to obtain the desired stack of material layers, with the material E of a first sequence of steps acting as the material S in a second sequence of steps, etc.

In a preferred implementation of the invention, it is possible to select a combination of materials S, I, and E such that:

$$a_s < a_i \qquad (1)$$

and $$a_e < a_i \qquad (2)$$

which generally leads to the melting temperature $T_F$ of the interface layer material I being less than that of the two materials E and S.

The interface material I can be selected from InSb, GaSb, CdTe, and Ge.

In particular, it is possible to select a combination of materials S, I, E such that:

$$a_s < a_e < a_i \qquad (3)$$

or preferably such that $$a_e < a_s < a_i \qquad (4)$$

in order to facilitate pseudomorphic deposition of the two materials I and E in ultrathin layers on the substrate material S.

On the basis of condition 4), it is possible, for example, to select the following combinations {S, I, E}={GaSb, InSb, InP}, {GaSb, InSb, GaAs}, {InAs, InSb, GaAs}, {InP, GaSb, AlAs}, and {Si, Ge, III-AsN}.

The present invention also provides any material obtained by the above-described method and used in making optoelectronic or microelectronic devices, e.g. a vertical microcavity laser.

DESCRIPTION OF A SPECIFIC EXAMPLE

The following example illustrates the invention without restricting its scope.

EXAMPLE

The stack S/I/E was made using the following materials InP/GaSb/AlAs. In that case:

The layer of interface material GaSb was deposited at a growth rate of 0.1 to 1 monolayers per second and at a temperature of 300° C. to 400° C. The thickness of the deposit was 3 monolayers, i.e. about 1 nm.

The AlAs material to be grown epitaxially was deposited at a growth rate of 1 monolayer per second and at a temperature in the range 300° C. to 400° C. The thickness of AlAs deposit was about 5 nm.

Melting step: the temperature was raised for a few seconds to 712° C. (it could have been a little less). Cooling also took place in a few seconds.

Growth of the AlAs material was continued at 680° C.

What is claimed is:

1. A method of making stacks of metamorphic layers of semiconductor materials of the III-V, II-VI, or IV type, having lattice mismatches of several percent between one another or relative to the substrate, the method implementing a material E having a melting temperature $T_F^e$, to be grown epitaxially on a substrate material S having a melting temperature $T_F^s$, via a misfit dislocation confining layer at the interface between E and S constituted by a material I having a low melting temperature $T_F$, compatible with not destroying the materials E and S, and the method comprising the following sequence of steps:
   a) pseudomorphic deposition of material I on the substrate material S at a temperature T lower than $T_F$;
   b) pseudomorphic deposition of material E on the material I constituting the interface layer, at a temperature less than $T_F$;
   c) annealing the interface layer at a temperature that is high enough to force relaxation of the layer of material E by generating dislocations that are located in I; and
   d) cooling the interface layer; and
   e) epitaxially growing material E or any other material having the same lattice parameter $a_e$.

2. A method according to claim 1, wherein the deposit of material I in step a) has a thickness from 1 to 10 monoatomic layers.

3. A method according to claim 1, wherein the deposit of material E in step b) has a thickness from 1 to 100 monoatomic layers.

4. A method according to claim 1, wherein the deposit of material I has a thickness and the temperatures at which steps a) and b) are implemented can be lowered relative to the usual growth temperature increasing the thickness of material I.

5. A method according to claim 1, wherein the material I is deposited in epitaxial equipment.

6. A method according to claim 1, wherein the material S of parameter $a_s$, the material I of parameter $a_i$, and the material E of parameter $a_e$, are selected wherein:

$$a_s < a_i \qquad 1)$$

and $$a_e < a_i \qquad 2)$$

thereby making it possible in general to satisfy the following conditions $T_F < T_F^s$ and $T_F < T_F^e$.

7. A method according to claim 1, wherein the material I is selected from InSb, GaSb, CdTe, or Ge.

8. A method according to claim 1, wherein:

$$a_s < a_e < a_i \qquad 3).$$

9. A method according to claim 1, wherein:

$$a_e < a_s < a_i \qquad 4).$$

10. A method according to claim 9, wherein the combinations of materials {S, I, E} are selected from the group consisting of {GaSb, InSb, InP}, {GaSb, InSb, GaAs}, {InAs, InSb, GaAs}, {InP, GaSb, AlAs}, and {Si, Ge, II-AsN}.

11. A method according to claim 1, wherein the sequence of steps a) and b) is repeated one to ten times.

12. A method according to claim 1, wherein the sequence of steps a) to e) is repeated an indefinite number of times.

13. A method according to claim 1, wherein the temperature at which step c) is implemented is equal to $T_F$.

14. The method of claim 1, wherein the optoelectronic device comprises a vertical microcavity laser.

15. A method of claim 5, wherein the epitaxial equipment comprises molecular beam expitaxy equipment.

* * * * *